United States Patent
Lee

(10) Patent No.: US 9,030,899 B2
(45) Date of Patent: May 12, 2015

(54) MEMORY DEVICE WITH POST PACKAGE REPAIR, OPERATION METHOD OF THE SAME AND MEMORY SYSTEM INCLUDING THE SAME

(71) Applicant: SK Hynix Inc., Gyeonggi-do (KR)

(72) Inventor: Joo-Hyeon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,832

(22) Filed: Dec. 15, 2013

(65) Prior Publication Data
US 2015/0098287 A1    Apr. 9, 2015

(30) Foreign Application Priority Data
Oct. 7, 2013    (KR) ......................... 10-2013-0119045

(51) Int. Cl.
*G11C 7/00* (2006.01)
*G11C 29/00* (2006.01)
*G11C 29/04* (2006.01)

(52) U.S. Cl.
CPC .............. *G11C 29/785* (2013.01); *G11C 29/04* (2013.01)

(58) Field of Classification Search
USPC ....................................................... 365/200
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,904,751 B2 | 6/2005 | Makki et al. | |
| 7,173,851 B1 | 2/2007 | Callahan et al. | |
| 7,269,047 B1 | 9/2007 | Fong et al. | |
| 7,746,712 B2 | 6/2010 | Kang et al. | |
| 2009/0157949 A1* | 6/2009 | Leibowitz | 711/103 |
| 2011/0280091 A1* | 11/2011 | Rooney et al. | 365/200 |
| 2014/0317338 A1* | 10/2014 | Song | 711/103 |

FOREIGN PATENT DOCUMENTS

KR    1020140120638    10/2014

* cited by examiner

*Primary Examiner* — Hoai V Ho
(74) *Attorney, Agent, or Firm* — IP & T Group LLP

(57) ABSTRACT

An operation method of a memory device includes entering a repair mode, changing an input path of setting data from a set path to a repair path in response to the entering of the repair mode, receiving the setting data together with a setting command, ending the repair mode after the receiving is repeated a set number of times, changing the input path of the setting data from the repair path to the set path in response to the ending of the repair mode, and programming a repair address for a defective memory cell of the memory device to a nonvolatile memory using the setting data.

11 Claims, 11 Drawing Sheets

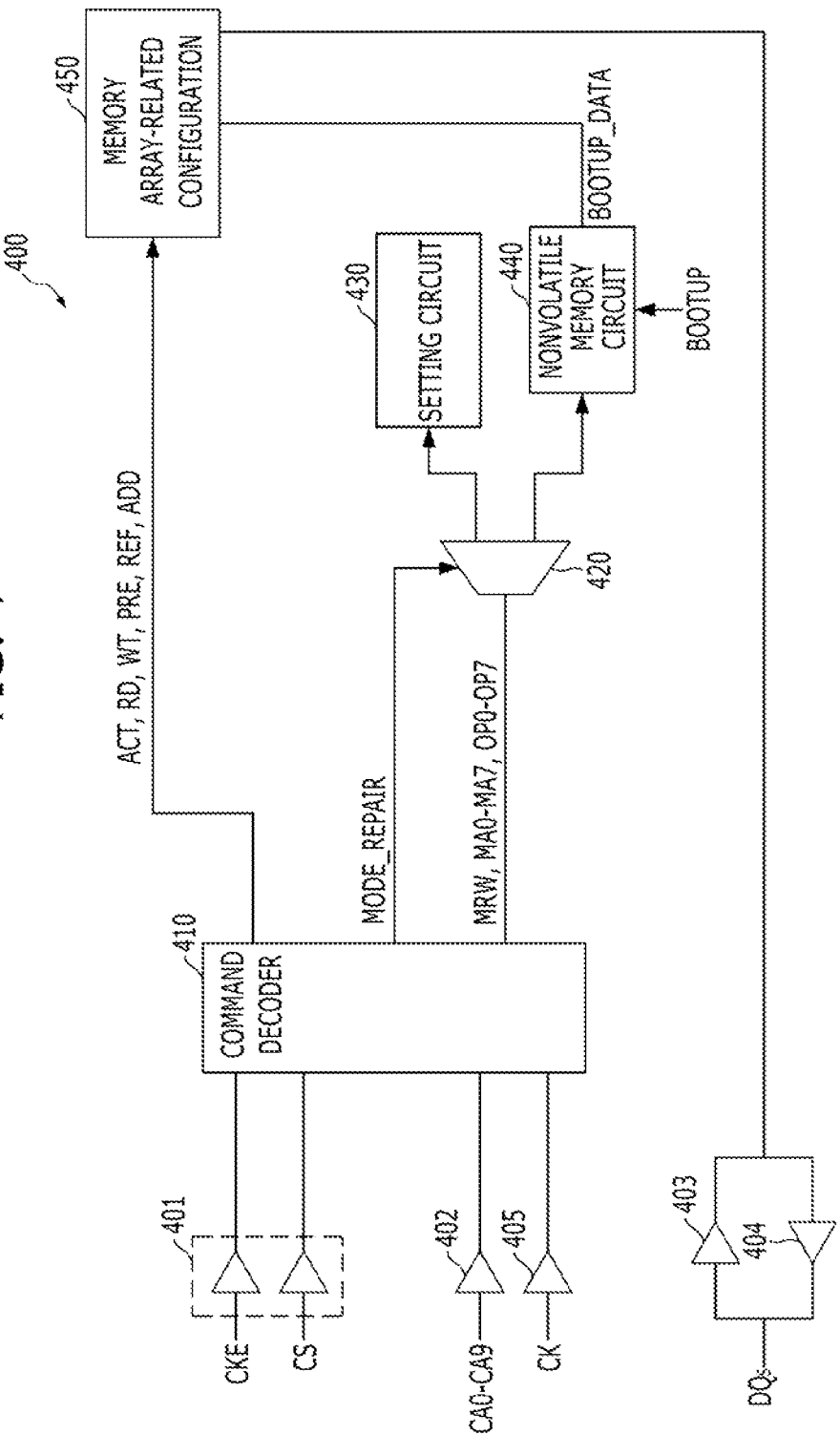

FIG. 5A

| SDRAM Command | NVM Command | SDR Command Pins | | | DDR CA pins (10) | | | | | | | | | | |
|---|---|---|---|---|---|---|---|---|---|---|---|---|---|---|---|
| | | CKE CK_t(n-1) | CK_t(n) | CS_N | CA0 | CA1 | CA2 | CA3 | CA4 | CA5 | CA6 | CA7 | CA8 | CA9 | CK_t EDGE |
| MRW | MRW | H | H | L | L | L | L | H | MA0 | MA1 | MA2 | MA3 | MA4 | MA5 | ↓↑ |
| | | | | X | MA6 | MA7 | OP0 | OP1 | OP2 | OP3 | OP4 | OP5 | OP6 | OP7 | ↓↑ |
| MRR | MRR | H | H | L | L | L | L | H | MA0 | MA1 | MA2 | MA3 | MA4 | MA5 | ↓↑ |
| | | | | X | MA6 | MA7 | | | | | | | | | ↓↑ |
| Refresh (per bank)[1] | — | H | H | L | L | L | H | L | | | X | | | | ↓↑ |
| | | | | X | | | | | | | | | | | ↓↑ |
| Refresh (all bank) | — | H | H | L | L | L | H | H | | | X | | | | ↓↑ |
| | | | | X | | | | | | | | | | | ↓↑ |
| Enter Self Refresh | Enter Power Down | H | L | L | L | L | H | H | | | X | | | | ↓↑ |
| | | X | | X | | | | | | | | | | | ↓↑ |
| Activate (bank) | Activate (row buffer) | H | H | L | R0/a5 | R1/a6 | R8/a15 | R9/a16 | R10/a17 | R11/a18 | R12/a19 | BA0 | BA1 | BA2 | ↓↑ |
| | | | | X | H | L | R2/a7 | R3/a8 | R4/a9 | R5/a10 | R6/a11 | R7/a12 | R13/a13 | R14/a14 | ↓↑ |
| Write (bank) | Write (RDB) | H | H | L | AP[3,4] | L | L | L | RFU | C1 | C2 | BA0 | BA1 | BA2 | ↓↑ |
| | | | | X | H | C3 | C4 | C5 | C6 | C7 | C8 | C9 | C10 | C11 | ↓↑ |
| Write (bank) | Write (RDB) | H | H | L | AP[3,4] | L | H | H | RFU | C1 | C2 | BA0 | BA1 | BA2 | ↓↑ |
| | | | | X | H | C3 | C4 | C5 | C6 | C7 | C8 | C9 | C10 | C11 | ↓↑ |

FIG. 5B

| SDRAM Command | NVM Command | SDR Command Pins CKE CK_t(n-1) | CKE CK_t(n) | CS_N | DDR CA pins (10) CA0 | CA1 | CA2 | CA3 | CA4 | CA5 | CA6 | CA7 | CA8 | CA9 | CK_t EDGE |
|---|---|---|---|---|---|---|---|---|---|---|---|---|---|---|---|
| Precharge (pre bank, all bank) | Preactive (RAB) | H | H | L | H | H | L | H | AB/a30 | X/a31 | X/a32 | BA0 | BA1 | BA2 | ↓ |
|  |  |  |  | X | X/a20 | X/a21 | X/a22 | X/a23 | X/a24 | X/a25 | X/a26 | X/a27 | X/a28 | X/a29 | ↑ |
| BST | BST | H | H | L | H | H | L | H |  |  |  |  |  |  | ↓ |
|  |  |  |  | X |  |  |  |  | X | X | X |  |  |  | ↑ |
| Enter Deep Power Down | Enter Power Down | H | L | L | H | H | L | L |  |  |  |  |  |  | ↓ |
|  |  | X |  | X |  |  |  |  | X | X | X |  |  |  | ↑ |
| NOP | NOP | H | H | L | H | H | H | H |  |  |  |  |  |  | ↓ |
|  |  |  |  | X |  |  |  |  | X | X | X |  |  |  | ↑ |
| Maintain PD,SREF,DPD Power Down (NOP) | Maintain Power Down (NOP) | L | L | L | H | H | H | H |  |  |  |  |  |  | ↓ |
|  |  |  |  | X |  |  |  |  | X | X | X |  |  |  | ↑ |
| NOP | NOP | H | H | H | X |  |  |  |  | X | X |  |  |  |  | ↓ |
|  |  |  |  | X |  |  |  |  | X | X |  |  |  |  | ↑ |
| Maintain PD,SREF,DPD Power Down (NOP) | Maintain Power Down (NOP) | L | L | H | X |  |  |  |  | X | X |  |  |  |  | ↓ |
|  |  |  |  | X |  |  |  |  | X | X |  |  |  |  | ↑ |
| Enter Power Down | Enter Power Down | H | L | H | X |  |  |  |  | X | X |  |  |  |  | ↓ |
|  |  | X |  | X |  |  |  |  | X | X |  |  |  |  | ↑ |
| Exit PD,SREF,DPD Power Down | Exit Power Down | L | H | H | X |  |  |  |  | X | X |  |  |  |  | ↓ |
|  |  |  |  | X |  |  |  |  | X | X |  |  |  |  | ↑ |

MEMORY DEVICE WITH POST PACKAGE REPAIR, OPERATION METHOD OF THE SAME AND MEMORY SYSTEM INCLUDING THE SAME

CROSS-REFERENCE TO RELATED APPLICATIONS

The present application claims priority of Korean Patent Application No. 10-2013-0119045, filed on Oct. 7, 2013, which is incorporated herein by reference in its entirety.

BACKGROUND

1. Field

Exemplary embodiments of the present invention relate to a memory device and a memory system including the same, and more particularly, to a repair-related technology.

2. Description of the Related Art

FIG. 1 is a diagram for explaining a repair operation in a typical memory device (for example, a DRAM).

FIG. 1 illustrates a configuration corresponding to one memory bank in a memory device. Referring to FIG. 1, the memory device includes a memory array 110 including a plurality of memory cells, a row circuit 120 for activating a word line selected by a row address R_ADD, and a column circuit 130 for accessing (reading or writing) data of a bit line selected by a column address.

A row fuse circuit 140 stores a row address which corresponds to a defective memory cell in the memory array 110, as a repair row address REPAIR_R_ADD. A row repair circuit 150 compares the repair row address REPAIR_R_ADD stored in the row fuse circuit 140 with a row address R_ADD inputted from the outside of the memory device. When the repair row address REPAIR_R_ADD coincides with the row address R_ADD, the row repair circuit 150 controls the row circuit 120 to activate a redundancy word line instead of a word line designated by the row address R_ADD. That is, a row (word line) corresponding to the repair row address REPAIR_R_ADD stored in the row fuse circuit 140 is replaced with a redundancy row (word line).

In FIG. 1, a signal RACT indicates a signal that is activated in response to an active command for activating a word line in the memory array 110, and deactivated in response to a precharge command for deactivating a word line. Furthermore, a signal RD indicates a read command and a signal WR indicates a write command.

In the row fuse circuit 140, a laser fuse is mainly used. The laser fuse stores 'high' or 'low' data according to whether the fuse has been cut. The laser fuse may be programmed in a wafer state, but it is not possible to program the laser fuse after a wafer is mounted in a package. It is difficult to design the laser fuse with a small area because there is a limitation in reducing a pitch thereof.

Therefore, as disclosed in U.S. Pat. Nos. 6,904,751, 6,777, 757, 6,667,902, 7,173,851, and 7,269,047, one of nonvolatile memories, such as an E-fuse array circuit, a NAND flash memory, a NOR flash memory, a MRAM (Magnetic Random Access Memory), a STT-MRAM (Spin Transfer Torque-Magnetic Random Access Memory), a ReRAM (Resistive Random Access Memory), or a PCRAM (Phase Change. Random Access Memory), is included into a memory device, and repair information (repair addresses) is stored in the nonvolatile memory for use.

FIG. 2 is a diagram illustrating an example in which a nonvolatile memory is used in a memory device in order to store repair information.

Referring to FIG. 2, the memory device includes a plurality of memory banks BK0 to BK3, registers 210_0 to 210_3 provided to the respective memory banks BK0 to BK3 to store repair information, and a nonvolatile memory 201.

The nonvolatile memory 201 is a substitution for the fuse circuit 140. The nonvolatile memory 201 stores repair information corresponding to all the banks BK0 to BK3, that is, repair addresses. The nonvolatile memory may include one of nonvolatile memories, such as an E-fuse array circuit, a NAND flash memory, a NOR flash memory a MRAM (Magnetic. Random. Access Memory), a STT-MRAM (Spin Transfer Torque-Magnetic Random Access Memory), a ReRAM (Resistive Random Access Memory), or a PCRAM (Phase Change Random Access Memory).

The registers 210_0 to 210_3 provided to the respective memory banks BK0 to BK3 store repair information of the corresponding memory bank. The register 210_0 stores repair information of the memory bank BK0, and the register 210_2 stores repair information of the memory bank BK2. Each of the registers 210_0 to 210_3 includes a latch circuit and is able to store repair information only when power is being supplied thereto. The repair information to be stored in the registers 210_0 to 210_3 is received from the nonvolatile memory 201.

The reason why the repair information stored in the nonvolatile memory 201 is not directly used but stored in the registers 210_0 to 210_3 and then used, is as follows. Since the nonvolatile memory 201 has an array structure, it takes a predetermined time to call data stored therein. Since it is difficult to immediately call data, a repair operation may not be performed properly by directly using data stored in the nonvolatile memory 201. Accordingly, a boot-up operation is performed to transmit the repair information stored in the nonvolatile memory 201 to the registers 210_0 to 210_3 for storage, and a repair operation is performed using the data stored in the registers 210_0 to 210_3 after the boot-up operation is performed.

In the case of replacing the fuse circuit 140 including a laser fuse with the nonvolatile memory 201 and the registers 210_0 to 210_3, additional defects may be found and repaired after a wafer state. There has been conducted research on a technology capable of checking the nonvolatile memory 201 and repairing checked defects thereof even after a memory device is fabricated (for example, even after a product is sold).

SUMMARY

Exemplary embodiments of the present invention are directed to a technology capable of repairing a memory device even after the memory device is fabricated.

In accordance with an exemplary embodiment of the present invention, an operation method of a memory device includes entering a repair mode, changing an input path of setting data from a set path to a repair path in response to the entering of the repair mode, receiving the setting data together with a setting command, ending the repair mode after the receiving is repeated a set number of times, changing the input path of the setting data from the repair path to the set path in response to the ending of the repair mode, and programming a repair address for a defective memory cell of the memory device to a nonvolatile memory using the setting data.

In accordance with another exemplary embodiment of the present invention, a memory device includes a command input unit suitable for receiving one or more command signals, a command/address input unit suitable for receiving a plurality of command/address signals, a command decoder suitable for decoding the command signals and the command/address signals, to determine whether to enter a repair mode and generate a setting command, a setting circuit suitable for setting the memory device using signals inputted through the command/address input unit in response to the setting command in other modes than the repair mode, and a nonvolatile memory circuit suitable for programming a repair address for a defective memory cell of the memory device using the signals inputted through the command/address input unit in response to the setting command in the repair mode.

In accordance with further exemplary embodiment of the present invention, an operation method of a memory system includes determining whether a memory device enters a repair mode in response to one or more control signals inputted from a memory controller, changing an input path of the control signals in the memory device based on the determining for the memory device of entering the repair mode, applying setting data as the control signals from the memory controller to the memory device a set number of times in the repair mode, and programming a repair address for a defective memory cell of the memory device to a nonvolatile memory of the memory device using the setting data.

According to the exemplary embodiments of the present invention, a memory device may be repaired even after the memory device is mounted.

Furthermore, even in a memory device such as a LPDDR (Low Power Double Data Rate) memory device in which it is difficult for a user to freely control data and addresses, the memory device may be repaired using an easy method.

BRIEF DESCRIPTION OF THE DRAWINGS

FIG. 4 is a block diagram of a memory device in accordance with one embodiment of the present invention.

FIGS. 5A and 5B are a command truth table.

DETAILED DESCRIPTION

Figure 1:
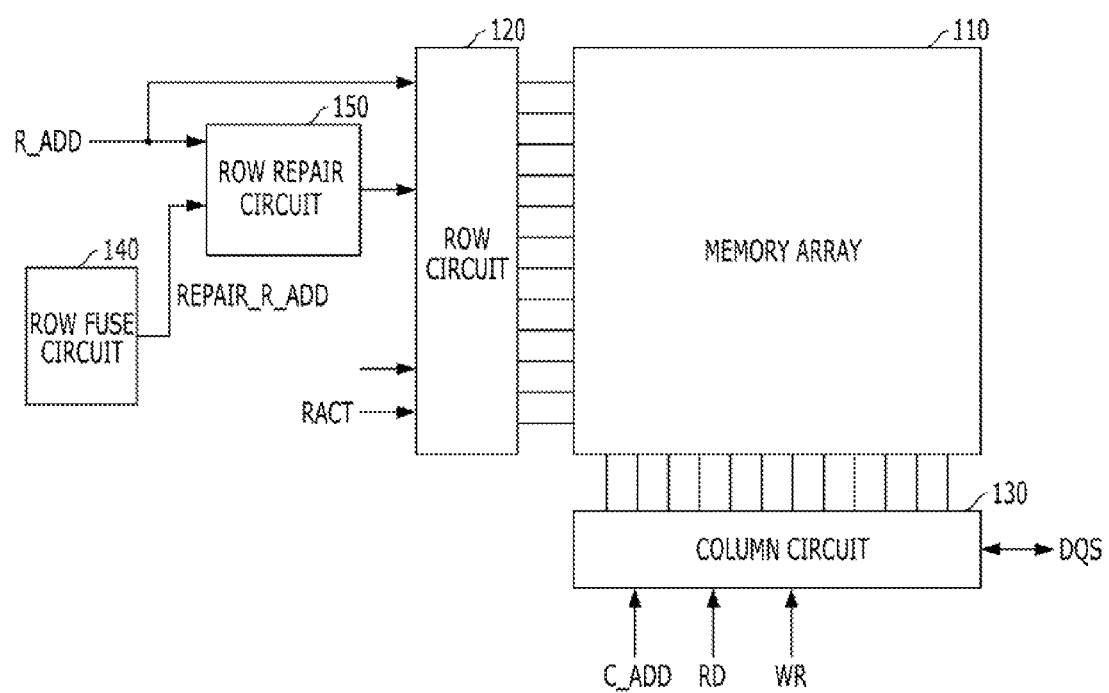
FIG. 1 is a diagram for explaining a repair operation in a typical memory device (for example, a DRAM).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupler" refers to one component not only directly coupling another component but also indirectly coupling another component through an intermediate component. In addition, a singular form may include a plural form as long as it is not specifically mentioned in a sentence.

Figure 3:
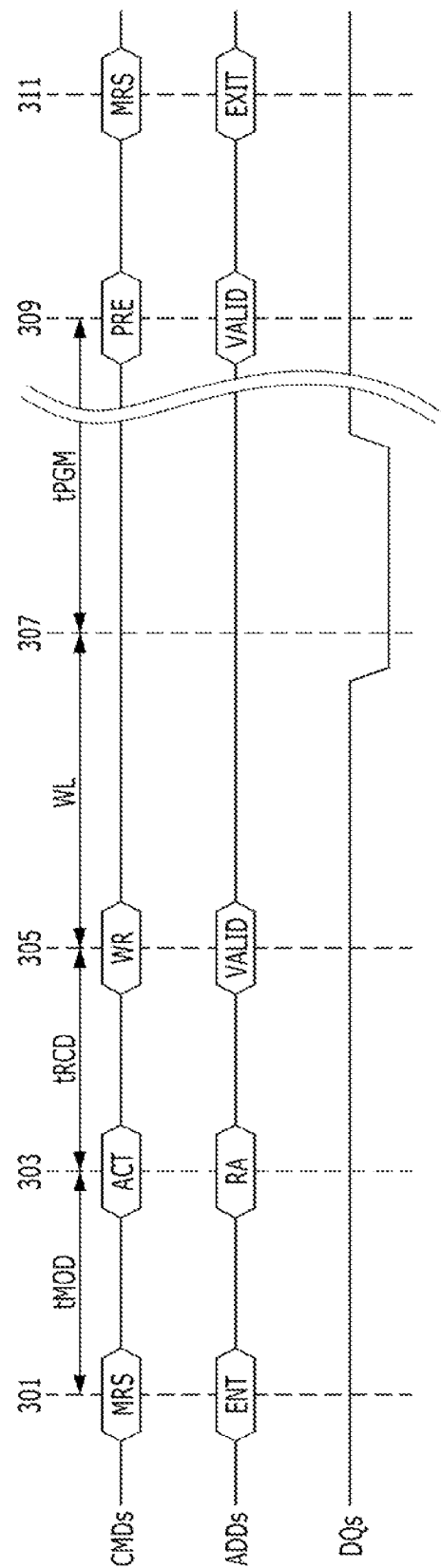
FIG. 3 is a timing diagram illustrating a post package repair process of a memory device according to a comparison example.

FIG. 3 is a timing diagram illustrating a post package repair process of a memory device according to a comparison example. The post package repair indicates repair that is performed after a memory device is fabricated (i.e., packaged), and the post package repair of a general memory such as a DDR (Double Data Rate) 3 or a DDR4 may be performed in the sequence illustrated in FIG. 3.

Referring to FIG. 3, at the time point '301', a combination (ENT indicating repair mode entry) of addresses for entry to a repair mode may be inputted to the memory device together with a setting command (MRS: Mode Register Setting). For example, a mode register 6 MR6 may be selected together with the application of the setting command MRS, and an address 8 may be inputted as '1'. Accordingly, the memory device may enter the repair mode. In FIG. 3, since tMOD indicates the time until a command (a Non-MRS command), other than the setting command MRS, may be inputted from the time at which the setting command MRS is inputted, tMOD may be regarded as the time necessary for the memory device to enter the repair mode by the setting command MRS and the combination of addresses inputted at the time point '301'. Before the memory device enters the repair mode, the memory device should substantially maintain the state in which all memory banks have been precharged.

After the repair mode entry of the memory device is completed (after the time tMOD passes), an active command ACT and a defect address RA are inputted to the memory device at the time point '303'. Then, the memory device may temporarily store the inputted defect address RA. The defect address RA may represent an address indicating the position of a defective cell in the memory device.

After time tRCD (Ras to Cas Delay time) passes from the time point at which the active command ACT is applied, a write command WR and a valid address VALID may be inputted to the memory device at the time point '305'. The memory device may not care which value of the valid address VALID is inputted together with the write command WR (the memory device regards the valid address as don't care). The memory device may check whether a logic state of data pads DQs is '0' at the time point '307' after the time corresponding to write latency (WL=CWL(Cas Write Latency)+AL(Additive Latency)+PL(Parity Latency)) passes from the time point '305' at which the write command WR is applied. When the logic state of data pads DQs is '0', it may indicate that the memory device is a target, and when the logic state of data pads DQs is '1', it may indicate that the memory device is not the target. The target may indicate a memory device, which will perform a repair operation, among memory devices in a system.

Figure 2:
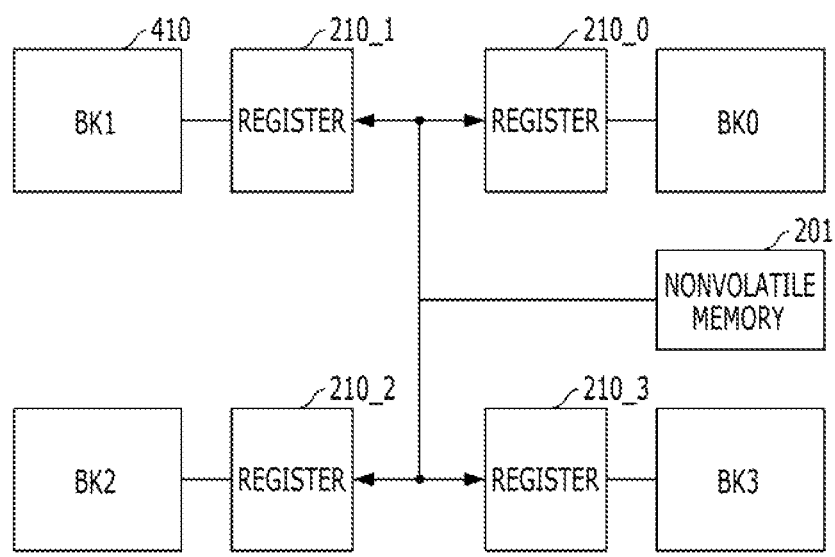
FIG. 2 is an exemplary diagram illustrating a memory device having an nonvolatile memory in order to store repair information.

When it is checked that the memory device is the target at the time point '307', the memory device may program the temporarily stored defect address RA inputted together with the active command ACT to a nonvolatile memory (indicating a nonvolatile memory that stores a defect address for repair similarly to the nonvolatile memory 201 of FIG. 2). In FIG. 3, tPGM may indicate the time necessary for the memory device to program the defect address RA a nonvolatile memory.

After the defect address RA is programmed to the nonvolatile memory (after the time tPGM), a precharge command PRE is inputted at the time point '309', so that an active state of the memory device is released. Then, at the time point '311', a combination (EXIT indicating repair mode exit) of addresses for exit from the repair mode may be inputted to the memory device together with the setting command MRS. For example, the mode register 6 MR6 may be selected together with the application of the setting command MRS, and the address 8 may be inputted as '0'. Accordingly, the repair mode of the memory device may be ended and a normal operation may be started.

The post package repair process of FIG. 3 may be briefly summarized as follows: (1) The repair mode entry of the memory device; (2) The application of the defect address RA together with the active command ACT; (3) The application of the write command WR; (4) Checking whether the memory device is a target through the data pads DQs after the time WL passes from the write command WR; (5) When the memory device is the target, The program of the defect address RA applied together with the active command ACT to the nonvolatile memory; (6) The application of the precharge command PRE after the programming is completed; and (7) The repair mode exit. Such processes are performed by applying desired signals to command pins CMDs, address pins ADDs, and data pins DQs, and since the control of these pins are free in a memory such as a DDR3 or a DDR4, the aforementioned sequence may be realized. However, in a memory such as a LPDDR (Low Power Double Data Rate) memory, pins for input of addresses and commands are combined and a virtual address is used for a system. There are various limitations in access of those pins and such control is difficult. In this regard, in a mobile memory such as a LPDDR, a new sequence and a control method for the post package repair are necessary and will be described below.

FIG. 4 is a block diagram of a memory device in accordance with one embodiment of the present invention.

Referring to FIG. 4, the memory device 400 may include a command input unit 401, a command/address input unit 402, a data input unit 403, a data output unit 404, a clock input unit 405, a command decoder 410, a path selection unit 420, a setting circuit 430, a nonvolatile memory circuit 440, and a memory array-related configuration 450. Names of the command input unit 401, the command/address input unit 402, the data input unit 403, and the data output unit 404 is decided based on the memory array-related configuration 450. For example, a command indicating a specific operation of the memory array-related configuration 450 and an address indicating the position of a memory cell to be accessed in the memory array-related configuration 450 are inputted through the command/address input unit 402. However, these may not be a command and an address based on another configuration (for example, the nonvolatile memory circuit 440).

The command input unit 401 may receive command signals CKE and CS that are inputted from the outside of the memory device 400. The command signals inputted to the memory device 400 may include a clock enable signal CKE and a chip select signal CS.

The command/address input unit 402 may receive command/address signals CA0 to CA9 that are inputted from the outside of the memory device 400. The command/address signals CA0 to CA9 may be 10 signals. These signals CA0 to CA9 may be used as command signals or address signals for the memory array-related configuration 450. Furthermore, these signals CA0 to CA9 may be used as command signals address signals, or data for the nonvolatile memory circuit 440.

The data input unit 403 may receive multi-bit data DQs that are inputted from the outside of the memory device 400, and the data output unit 404 may output data to the outside of the memory device 400. For example, data to be written in the memory array-related configuration 450 may be inputted through the data input unit 403, and data read from the memory array-related configuration 450 may be outputted through the data output unit 404.

The clock input unit 405 may receive a clock CK that is inputted from the outside of the memory device 400. The clock CK may be used for a synchronized operation of the memory device 400.

The command decoder 410 may decode the command signals CKE and CS inputted through the command input unit 401 and the command/address signals CA0 to CA9 inputted through the command/address input unit 402, and generate an active signal (ACT: activate), a precharge signal (PRE: precharge), a read signal (RD: read), a write signal (WR: write), a refresh signal (REF: refresh) and the like, which are internal command signals for the memory array-related configuration. In an operation using an address such as active, write, or precharge operation, the command decoder 410 may transfer some of the command/address signals CA0 to CA9 to the memory array-related configuration 450 as addresses ADD. FIGS. 5A and 5B are a command truth table in the JEDEC (Joint Electron Device Engineering Council) SPEC of a LPDDR2 (Low Power Double Data Rate 2) memory. Referring to FIGS. 5A and 5B, it may be checked the combinations of the command signals CKE and CS and the command/address signals CA0 to CA9, which are used to generate the internal command signals ACT, PRE, RD, WR, and REF for the memory array-related configuration 450 and the addresses ADD. For example, referring to FIGS. 5A and 5B, when the clock enable signal substantially maintains a 'H' level for two cycles, the signal CS is 'H' at the rising edge of the clock CK, and (CA0, CA1)=(L, H), an active command is recognized by the command decoder 410, and the active command ACT is activated. Furthermore, since the command/address signals CA2 to CA9 inputted at the rising edge of the clock CK and the command/address signals CA0 to CA9 inputted at the falling edge of the clock CK are recognized as addresses for an active operation, the command decoder 410 supplies these signals to the memory array-related configuration 450 as the addresses ADD.

The command decoder 410 may generate a setting recording command signal MRW for the setting circuit 430. The setting recording command signal MRW is a signal for recording a setting value in the setting circuit 430. Referring to FIGS. 5A and 5B, in the state in which the clock enable signal CKE substantially maintains a 'H' level for two cycles when (CS, CA0, CA1, CA2, CA3)=(L, L, L, L, L) at the rising edge of the clock CK, the command decoder 410 activates the setting recording command signal MRW. Furthermore, the command/address signals CA4 to CA9 inputted at the rising edge of the clock CK and the command/address signals CA0 and CA1 inputted at the falling edge of the clock CK are recognized as MA0 to MA5, and the command/address signals CA2 to CA9 inputted at the falling edge of the clock CK are recognized as OP0 to OP7. The MA0 to MA5 may be setting designation codes for designating the type of setting, and the OP0 to OP7 may be setting data codes for deciding values in the setting designated by the setting designation codes MA0 to MA5. For example, setting a reference voltage among various setting types may be decided by the setting designation codes MA0 to MA5, and a value of the reference voltage may be decided by the setting data codes OP0 to OP7. After a mobile memory such as a LPDDR is mounted in an application (for example, a mobile phone), the setting data codes OP0 to OP7 are most easily accessible by a user. Accordingly, in the present embodiment, a repair address is programmed to the nonvolatile memory circuit 440 using the setting data codes OP0 to OP7. That is, defects in the memory array-related, configuration 450 are repaired.

Entry to the repair mode for programming the repair address to the nonvolatile memory circuit 440 may be controlled by the command decoder 410. Referring to FIGS. 5A and 5B, there are unused combinations in the command truth table in the JEDEC SPEC. One of these combinations may be stipulated as a command for the entry to the repair mode. For example, one of the combinations indicating NOP (Non Operation) in the command truth table may be stipulated as a command for the entry to the repair mode. When the command signals CKE and CS and the command/address signals CA0 to CA9 are inputted as a combination corresponding to the entry to the repair mode, the command decoder 410 may activate a repair mode signal MODE_REPAIR, and then deactivate the repair mode signal MODE_REPAIR after information enough for programming the repair address to the nonvolatile memory circuit 440 is transferred.

The path selection unit 420 may transfer the setting command signal MRW, the setting designation codes MA0 to MA5, and the setting data codes OP0 to OP7, which are outputted from the command decoder 410, to the setting circuit 430 or the nonvolatile memory circuit 440 according to the activation/deactivation of the repair mode signal MODE_REPAIR. While the repair mode signal MODE_REPAIR is being deactivated, the path selection unit 420 may transfer the inputted signals MRW, MA0 to MA5, and OP0 to OP7 to the setting circuit 430, and while the repair mode signal MODE_REPAIR is being activated, the path selection unit 420 may transfer the inputted signals MRW and OP0 to OP7 to the nonvolatile memory circuit 440. Since the nonvolatile memory circuit 440 may not use the setting designation codes MA0 to MA5, the nonvolatile memory circuit 440 may not receive the setting designation codes from the path selection unit 420.

The setting circuit 430 performs a setting operation using the signals MRW, MA0 to MA5 and OP0 to OP7 transferred from the path selection unit 420. The setting command signal MRW is used as an activation signal for allowing the setting circuit 430 to start the setting operation, and the setting designation codes MA0 to MA5 are used in order to select the type of a setting operation to be performed. For example, setting of a specific timing parameter may be selected by the setting designation codes MA0 to MA5, and a value of the selected timing parameter may be decided by the setting data codes OP0 to OP7.

The nonvolatile memory circuit 440 may output information BOOTUP_DATA stored therein in response to the activation of a boot-up signal BOOTUP. The nonvolatile memory circuit 440 may store information (repair information) indicating the position of a defective cell in the memory array-related configuration 450. The nonvolatile memory circuit 440 may program the repair information using the signals MRW and OP0 to OP7 transferred from the path selection unit 420. The configuration of the nonvolatile memory circuit 440 will be described in detail with reference to FIG. 6.

The memory array-related configuration 450 may perform an operation such as active, precharge, read, or write operation according to an instruction of the command decoder 410. In the write operation, data inputted from the outside of the memory device 400 through the data input unit 403 may be stored in the memory array-related configuration 450, and in the read operation, the data stored in the memory array-related configuration 450 may be outputted to the outside of the memory device 400 through the data output unit 404. The configuration of the memory array-related configuration 450 will be described in detail with reference to FIG. 8.

The main function of the memory device 400 is a write operation for storing data inputted from the outside of the memory device 400, and a read operation for providing the stored data to the outside of the memory device 400. Therefore, the capacity of the memory array-related configuration 450, in which the read and write operations are performed, is relatively large, but the capacity of the nonvolatile memory circuit 440, which simply stores information for memory array-related configuration repair, may be relatively small. For example, when several gigabits of data are stored in the memory array-related configuration 450, several to several tens of megabits of data may be stored in the nonvolatile memory circuit.

In FIG. 4, all configurations and operations of the memory device 400 have not been described, and the configuration and the operation related to the post package repair have been described.

Figure 6:
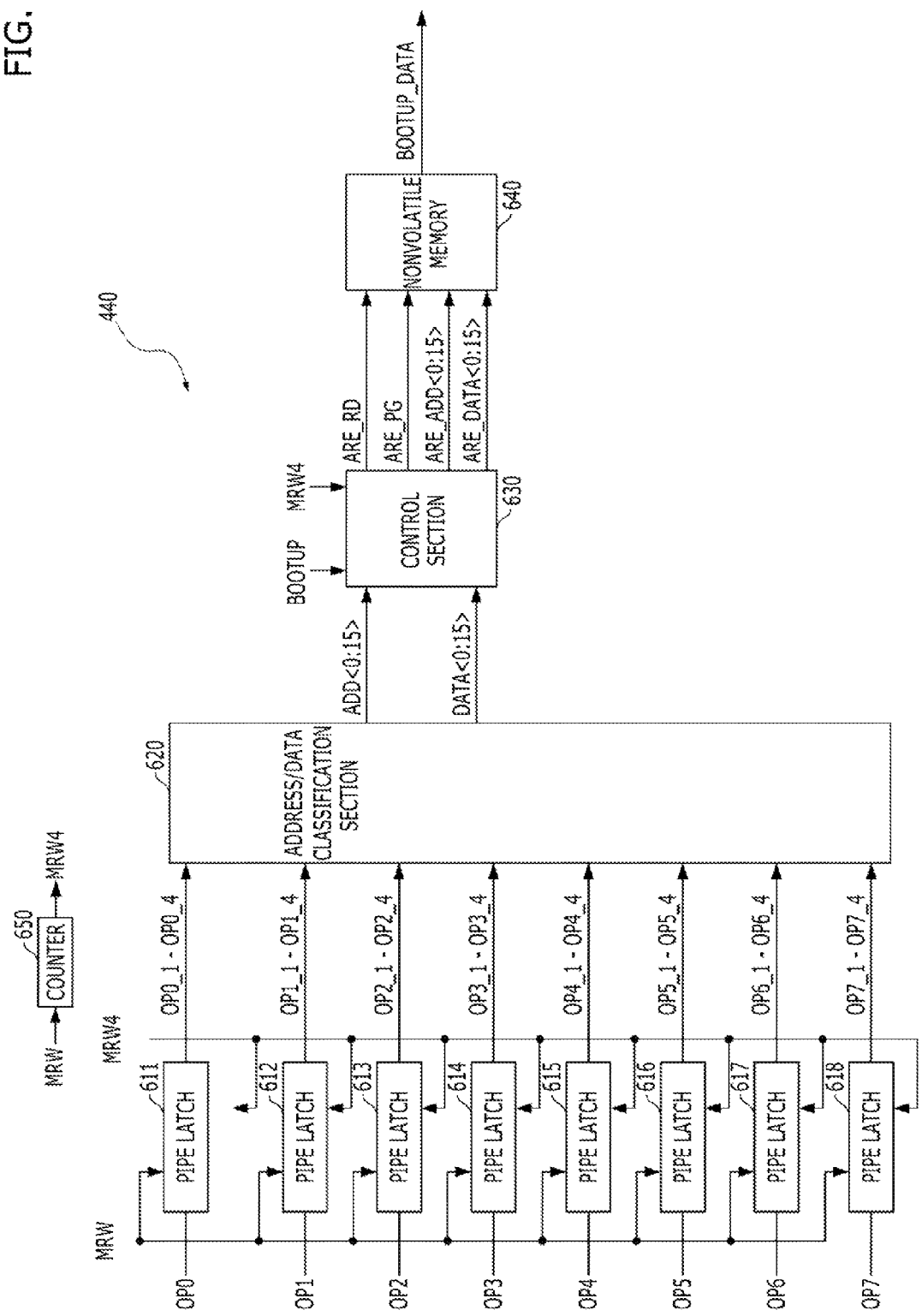
FIG. 6 is a block diagram of a nonvolatile memory circuit shown in FIG. 4.

FIG. 6 is a block diagram of the nonvolatile memory circuit shown in FIG. 4.

Referring to FIG. 6, the nonvolatile memory circuit 440 may include a plurality of pipe latches 611 to 618, an address/data classification section 620, a control section 630, a nonvolatile memory 640, and a counter 650.

The counter 650 may activate a control signal MRW4 whenever the setting command signal MRW is activated four times. The nonvolatile memory circuit 440 performs a one-time program operation whenever the setting data OP0 to OP7 are inputted four times together with the setting command signal MRW, wherein the control signal MRW4 may be used as a signal for informing that the setting command signal MRW has been activated four times.

The plurality of pipe latches 611 to 618 may store the setting data OP0 to OP7 and provide the setting data OP0 to OP7 to the address/data classification section 620. Each of the pipe latches 611 to 618 may receive, store, and shift the setting data in response to the activation of the setting command signal MRW. Each of the pipe latches 611 to 618 may have a serial input parallel output structure. The pipe latches 611 to 618 may provide the address/data classification section 620 with the eight setting data OP0 to OP7 inputted four times, that is, the total 32 setting data OP0_1 to OP0_4, OP1_1 to OP1_4, OP2_1 to OP2_4, OP3_1 to OP3_4, OP4_1 to OP4_4, OP5_1 to OP5_4, OP6_1 to OP6_4, and OP7_1 to OP7_4. For example, the output OP0_1 of the pipe latch 611 is the setting data OP0 inputted to the pipe latch 611 in synchronization with the first activation of the setting command signal MRW, the output OP0_2 of the pipe latch 611 is the setting data OP0 inputted to the pipe latch 611 in synchronization with the second activation of the setting command signal MRW, the output OP0_3 of the pipe latch 611 is the setting data OP0 inputted to the pipe latch 611 in synchronization with the third activation of the setting command signal MRW, and the output OP0_4 of the pipe latch 611 is the setting data OP0 inputted to the pipe latch 611 in synchronization with the fourth activation of the setting command signal MRW. The pipe latches 611 to 618 may be reset in response to the control signal MRW4. The internal configuration of the pipe latches 611 to 618 will be described in detail with reference to FIG. 7.

The address/data classification section 620 may classify the 32 setting data OP0_1 to OP0_4, OP1_1 to OP1_4, OP2_1 to OP2_4, OP3_1 to OP3_4, OP4_1 to OP4_4, OP5_1 to OP5_4, OP6_1 to OP6_4, and OP7_1 to OP7_4, which have been transferred from the pipe latches 611 to 618, into addresses ADD and data DATA. For example, among the 32 setting data OP0_1 to OP0_4, OP1_1 to OP1_4, OP2_1 to OP2_4, OP3_1 to OP3_4, OP4_1 to OP4_4, OP5_1 to OP5_4, OP6_1 to OP6_4, and OP7_1 to OP7_4, 16 setting data may be classified into addresses ADD<0:15> and the remaining 16 setting data may be classified into data DATA<0:15>.

The control section 630 may control the operation of the nonvolatile memory 640. The operation of the nonvolatile memory 640 controlled by the control section 630 may include a boot-up operation and a program operation. In the boot-up operation in which the boot-up signal BOOTUP is activated, the control section 630 periodically activates a read signal ARE_RD of the nonvolatile memory 640 such that all information stored in the nonvolatile memory 640 may be read. Whenever the read signal ARE_RD is activated, the control section 630 may change addresses ARE_ADD<0:15> supplied to the nonvolatile memory 640, and control all the information stored in the nonvolatile memory 640 to be sequentially read. In the boot-up operation, the addresses ARE_ADD<0:15> supplied to the nonvolatile memory 640 may be generated by a counting scheme. The program operation control of the control section 630 may be performed in response to the activation of the control signal MRW4. In the program operation, the control section 630 may activate a program signal ARE_PG of the nonvolatile memory 640, and supply the nonvolatile memory 640 with data ARE_DATA<0:15> to be programmed to the nonvolatile memory 640, and the addresses ARE_ADD<0:15> that designate the position at which the data is to be programmed in the nonvolatile memory 640. In the program operation, the data DATA<0:15> and the addresses ADD<0:15> may be supplied from the address/data classification section 620 to the nonvolatile memory 640 as the data ARE_DATA<0:15> and the addresses ARE_ADD<0:15> respectively.

The nonvolatile memory 640 may output the data ARE_DATA<0:15>, which has been stored at positions corresponding to the addresses ARE_ADD<0:15>, as boot-up data BOOTUP_DATA when the read signal ARE_RD is activated. Furthermore, when the program signal ARE_PG is activated, the nonvolatile memory 640 may program the data ARE_DATA<0:15> at the positions corresponding to the addresses ARE_ADD<0:15>. The nonvolatile memory 640 may be one of nonvolatile memories such as an E-fuse array circuit, a NAND flash memory, a NOR flash memory, a MRAM (Magnetic Random Access Memory), a STT-MRAM (Spin Transfer Torque-Magnetic Random Access Memory), a ReRAM (Resistive Random Access Memory), or a PCRAM (Phase Change Random Access Memory).

Figure 7:
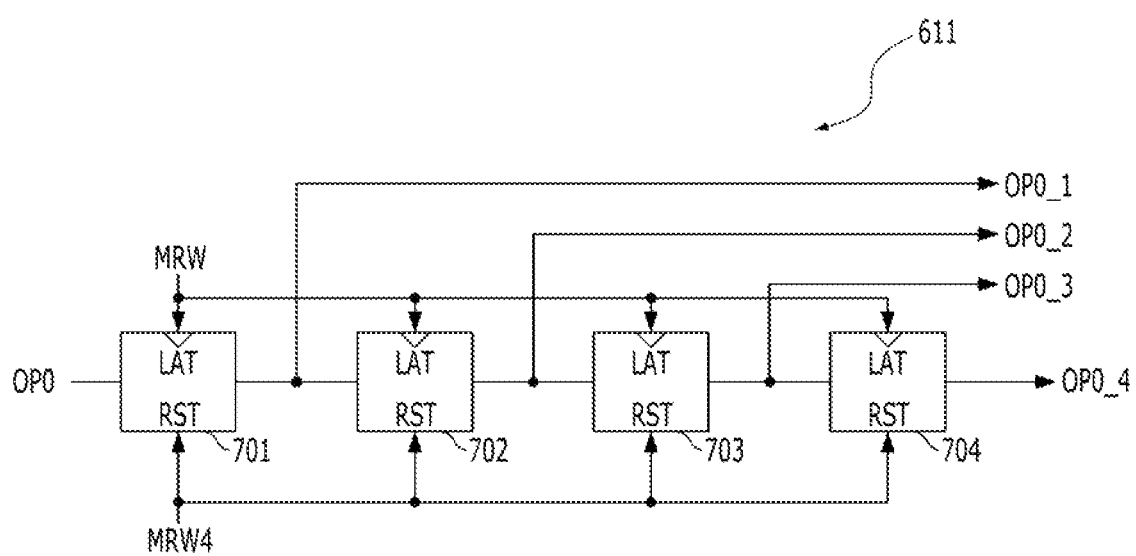
FIG. 7 is a detailed diagram of a pipe latch shown in FIG. 6.

FIG. 7 is a block diagram of the pipe latch 611 of FIG. 6.

Referring to FIG. 7, the pipe latch 611 may include four latches 701 to 704 serially coupled to one another. Each of the latches 701 to 704 may operate in synchronization with the setting command signal MRW. Whenever the setting command signal MRW is activated, values stored in the latches 701 to 704 may be shifted to a latch in a rear stage. For example, when the setting command signal MRW is activated, the setting data OP0 may be inputted to and stored in the latch 701, the setting data OP0_1 may be inputted to and stored in the latch 702, the setting data OP0_2 may be inputted to and stored in the latch 703, and the setting data OP0_3 may be inputted to and stored in the latch 704.

The values stored in the latches 701 to 704 may be initialized in response to the activation of the control signal MRW4.

Figure 8:
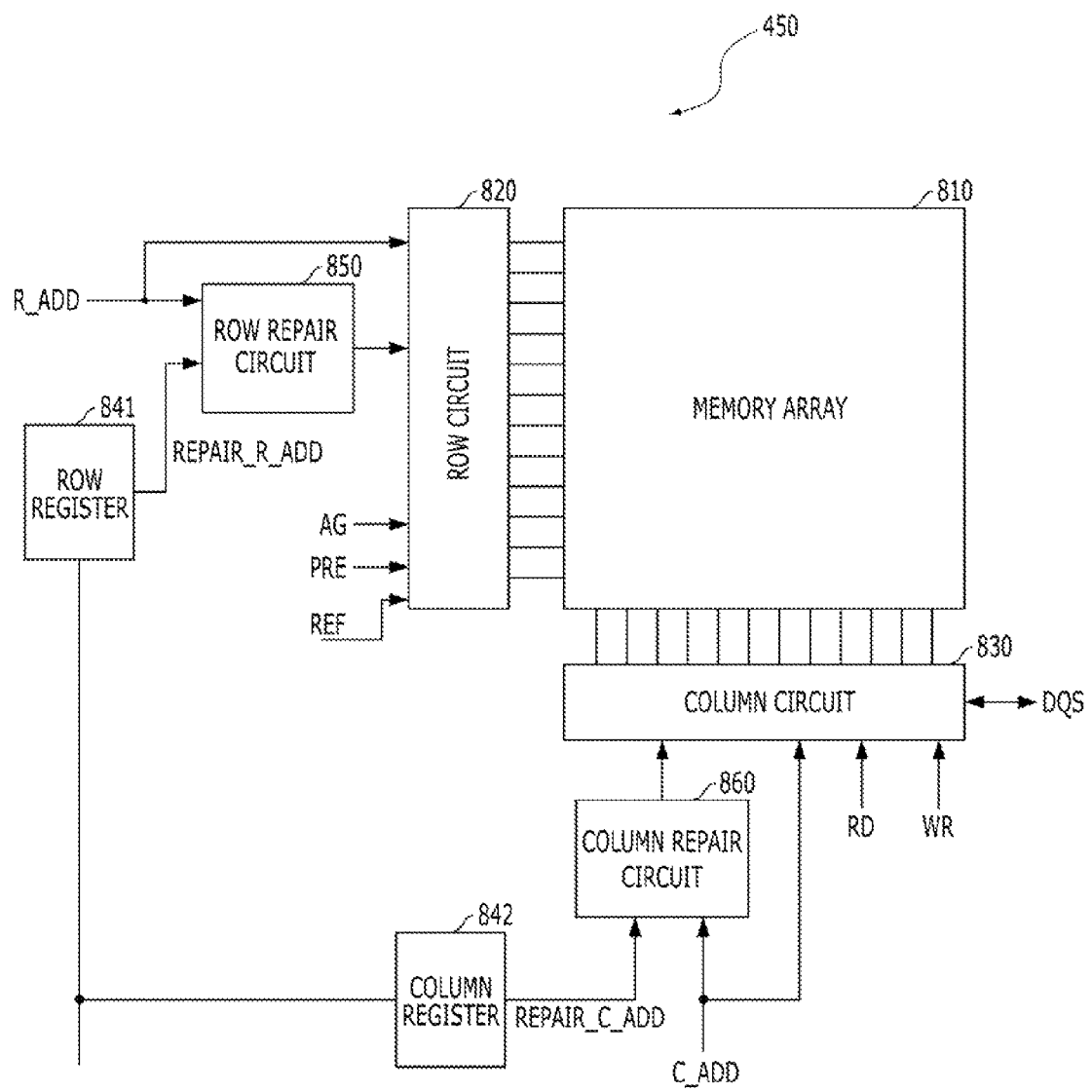
FIG. 8 is a block diagram of a memory array-related configuration shown in FIG. 4.

FIG. 8 is a block diagram of the memory array-related configuration shown in FIG. 4

Referring to FIG. 8, the memory array-related configuration 450 may include a memory array 810 including a plurality of memory cells, a row circuit 820, a column circuit 830, a row register 841, a column register 842, a row repair circuit 850, and a column repair circuit 860.

The row register 841 may store information for repairing a row of the memory array among the boot-up data BOOTUP_DATA transferred from the nonvolatile memory circuit 440. The information for repairing the row may be a repair row address REPAIR_R_ADD indicating a defective row in the memory array 810.

The row repair circuit 850 may compare the repair row address REPAIR_R_ADD transferred from the row register 841 with a row address R_ADD, and transfer a result of the comparison to the row circuit 820.

The row circuit 820 may activate a word line, which is selected by the row address R_ADD in the memory array 810, at the time of activation of the internal active signal ACT. When the row circuit 820 is informed that the row address R_ADD coincides with the repair row address REPAIR_R_ADD from the row repair circuit 850, the row circuit 820 does not activate a word line corresponding to the row address R_ADD and activates a redundancy word line. That is, a row (word line) corresponding to the repair row address REPAIR_R_ADD stored in the row register 841 is replaced with a redundancy row (word line). When the internal precharge command PRE is activated, the row circuit 820 deactivates the activated word line.

The column register 842 may store information for repairing a column of the memory array among the boot-up data BOOTUP_DATA transferred from the nonvolatile memory circuit 440. The information for repairing a column may be a repair column address REPAIR_C_ADD indicating a defective column in the memory array 810.

The column repair circuit 860 may compare the repair column address REPAIR_C_ADD transferred from the column register 842 with a column address C_ADD, and transfer a result of the comparison to the column circuit 830.

The column circuit 830 accesses data of a bit line selected by the column address C_ADD. When the internal read signal RD is activated, the column circuit 830 outputs data from the selected bit line, and when the internal write signal WT is activated, the column circuit 830 transfers data to the selected bit line and allows the data to be written. When the column circuit 830 is informed that the column address C_ADD coincides with the repair column address REPAIR_C_ADD from the column repair circuit 860, the column circuit 830 does not access a bit line corresponding to the column address C_ADD, and accesses a redundancy bit line. That is, a column (bit line) corresponding to the repair column address stored in the column register 842 is replaced with a redundancy column (bit line).

Figure 9:
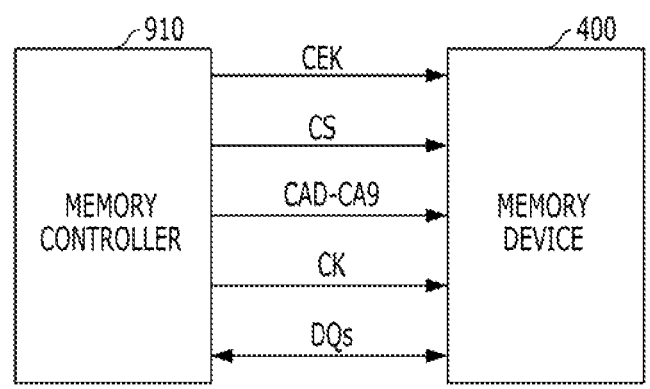
FIG. 9 is a block diagram of a memory system in accordance with one embodiment of the present invention.

FIG. 9 is a block diagram of a memory system in accordance with one embodiment of the present invention.

Referring to FIG. 9, the memory system includes a memory controller 910 and the memory device 400.

The memory controller 910 applies the command signals CKE and CS, the command/address signals CA0 to CA9, and the clock CK to the memory device 400, exchanges data DQs with the memory device 400, and writes or reads the data DQs in/from the memory device 400. The memory controller 910 may set the memory device 400, or control the memory device 400 such that a defect of the memory device 400 is repaired. The repair of the memory device 400 may be performed by programming the nonvolatile memory circuit 440 of the memory device 400.

Figure 10:
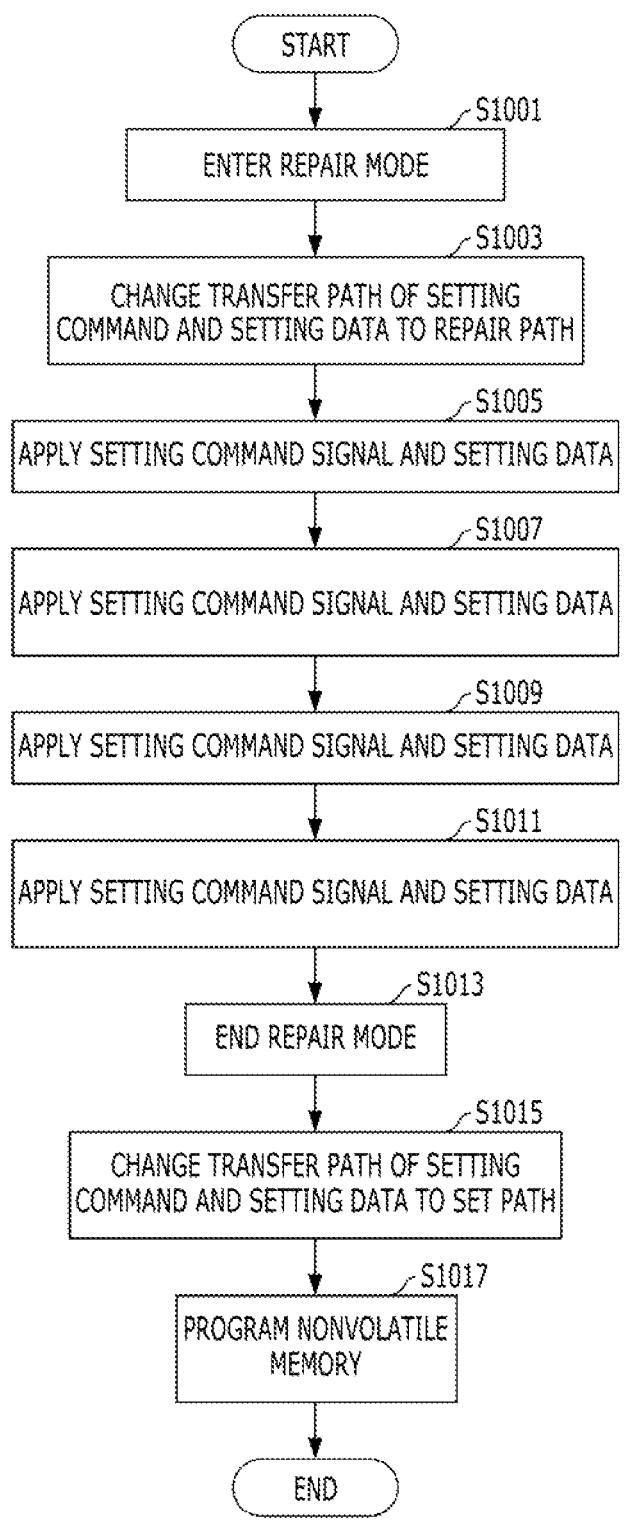
FIG. 10 is a flow chart illustrating a repair process of a memory device in accordance with one embodiment of the present invention.

FIG. 10 is a flow chart illustrating a repair process of the memory device 400 in accordance with one embodiment of the present invention.

First, the memory device 400 may enter a repair mode (S1001). The entry of the memory device 400 to the repair mode may be performed under the control of the memory controller 910. As described above, one of the unused combinations and the combinations indicating the NOP in the truth table of FIGS. 5A and 5B may be used a command combination for the entry to the repair mode.

The memory device 400 enters the repair mode (the repair mode signal MODE_REPAIR is activated), so that a transfer path of the setting command signal MRW and the setting data OP0 to OP7 may be changed from the setting circuit 430 to the nonvolatile memory circuit 440 (S1003). That is, the transfer path is changed such that the setting command signal MRW and the setting data OP0 to OP7 are not transferred to a path for setting the memory device 400, but transferred to a path for repairing the memory device.

The process, in which the setting data is applied to the memory device 400 together with the setting command, may be repeated four times (S1005, S1007, S1009, and S1011). The setting command and the setting data may be applied from the memory controller 910 to the memory device 400. In these steps S1005, S1007, S1009, and S1011, the setting command signal MRW may be activated four times in the memory device 400, the setting data OP0 to OP7 may be inputted to the nonvolatile memory circuit 440 four times in response to the activation of the setting command signal MRW, and the total 32 setting data OP0_1 to OP0_4, OP1_1 to OP1_4, OP2_1 to OP2_4, OP3_1 to OP3_4, OP4_1 to OP4_4 OP5_1 to OP5_4, OP6_1 to OP6_4, and OP7_1 to OP7_4 may be stored in the pipe latches 611 to 618.

When the application of the setting command and the setting data is repeated by a predetermined number of times (four times), the repair mode of the memory device 400 may be ended (S1013). The repair mode is ended (the repair mode signal MODE_REPAIR is deactivated), so that the transfer path of the setting data in the memory device 400 may be changed from the nonvolatile memory circuit 440 to the setting circuit 430 (S1015).

Since the setting data necessary for programming the nonvolatile memory circuit 440 has been sufficiently ensured, the nonvolatile memory circuit 440 may be programmed (S1017). This may be performed by classifying the data OP0_1 to OP0_4, OP1_1 to OP1_4, OP2_1 to OP2_4, OP3_1 to OP3_4, OP4_1 to OP4_4, OP5_1 to OP5_4, OP6_1 to OP6_4, and OP7_1 to OP7_4 stored in the pipe latches 611 to 618 into the addresses ADD<0:15> and the data DATA<0:15> by the address/data classification section 620, and programming the nonvolatile memory 640 under the control of the control section 630. The data ARE_DATA<0:15> programmed to the nonvolatile memory 640 may be information for repairing the memory array-related configuration 450.

As described above, the nonvolatile memory circuit 440 in the memory device 400 may be programmed by inputting the setting data OP0 to OP7. Consequently, even after the memory device 400 is mounted on an application, the memory device 400 may easily repair its defects.

FIG. 10 illustrates that step S1017 is performed after steps S1013 and S1015. However, it is sufficient if step S1017 is performed after steps S1005, S1007, S1009, and S1011 are performed. Accordingly, step S1017 may be performed before steps S1013 and S1015, or step S1017 and steps S1013 and S1015 may be simultaneously performed.

While the present invention has been described with respect to the specific embodiments, it will be apparent to those skilled in the art that various changes and modifications may be made without departing from the spirit and scope of the invention as defined in the following claims.

Particularly, the aforementioned embodiment has been described using a LPDDR memory. However, it is noted that the present invention may also be applied to other types of memories as well as the LPDDR memory.

What is claimed is:

1. An operation method of a memory device, comprising:
   entering a repair mode;
   changing an input path of setting data from a set path to a repair path in response to the entering of the repair mode;
   receiving the setting data together with a setting command;
   ending the repair mode after the receiving is repeated a set number of times;
   changing the input path of the setting data from the repair path to the set path in response to the ending of the repair mode; and
   programming a repair address for a defective memory cell of the memory device to a nonvolatile memory using the setting data,
   wherein, in the receiving of the setting data together with the setting command, the setting command is transmitted at a rising edge of a clock and the setting data is transmitted at a falling edge of the clock.

2. The operation method of claim 1, wherein, in a memory array of the memory device, memory cells corresponding to the repair address programmed to the nonvolatile memory are replaced with redundancy memory cells.

3. The operation method of claim 1, wherein the memory device includes a LPDDR (Low Power Double Data Rate) memory device.

4. A memory device comprising:
   a command input unit suitable for receiving one or more command signals;
   a command/address input unit suitable for receiving a plurality of command/address signals;
   a command decoder suitable for decoding the command signals and the command/address signals, to determine whether to enter a repair mode and generate a setting command;
   a setting circuit suitable for setting the memory device using signals inputted through the command/address input unit in response to the setting command in other modes than the repair mode; and
   a nonvolatile memory circuit suitable for programming a repair address for a defective memory cell of the memory device using the signals inputted through the command/address input unit in response to the setting command in the repair mode,
   wherein the nonvolatile memory circuit comprises:
      a nonvolatile memory;
      a plurality of pipe latches suitable for storing setting data of the signals inputted through the command/address input unit:
      an address/data classification section suitable for classifying the setting data stored in the plurality of pipe latches into an address and data and
      a control section suitable for controlling the data classified by the address/data classification section to be programmed to a position designated by the address classified by the address/data classification section in the nonvolatile memory.

5. The memory device of claim 4, further comprising:
   a memory array including a plurality of memory cells;
   a register suitable for receiving and storing the repair address stored in the nonvolatile memory circuit in an initial operation of the memory device; and a repair circuit suitable for replacing memory cells corresponding to the repair address stored in the register in the memory array with redundancy memory cells.

6. The memory device of claim 4, wherein the command decoder activates a repair mode signal at an entry of the repair mode by determining whether to enter the repair mode through the decoding.

7. The memory device of claim 6, further comprising:
a path selection unit suitable for transferring the signals inputed through the command/address input unit to the setting circuit or the nonvolatile memory circuit in response to the repair mode signal.

8. The memory device of claim 6, wherein the command decoder deactivates the repair mode signal when the setting command is activated a set number of times after the entry of the repair mode.

9. The memory device of claim 4, wherein the memory device includes a LPDDR (Low Power Double Data Rate) memory device.

10. An operation method of a memory system, comprising:
determining whether a memory device enters a repair mode in response to one or more command signals and command/address signals inputted from a memory controller;
changing an input path of the one or more command signals and the command/address signals in the memory device based on the determining for the memory device of entering the repair mode;
applying the one or more command signals and the command/address signals from the memory controller to the memory device a set number of times in the repair mode; and
programming a repair address for a defective memory cell of the memory device to a nonvolatile memory of the memory device using the command/address signals,
wherein, in the applying of the one or more command signals and the command/address signals, the one or more command signals are transmitted at a rising edge of clock and the command/address signals are transmitted at a falling edge of the clock.

11. The operation method of claim 10, further comprising:
ending the repair mode of the memory device after the applying of the one or more command signals and the command/address signals; and
changing the input path of the one or more command signals and the command/address signals in the memory device after the ending of the repair mode.

* * * * *